United States Patent
Yoshii

(10) Patent No.: US 11,543,467 B2
(45) Date of Patent: Jan. 3, 2023

(54) MAGNETIC FIELD SOURCE DETECTING APPARATUS AND MAGNETIC FIELD SOURCE DETECTING METHOD

(71) Applicant: SUMIDA CORPORATION, Tokyo (JP)

(72) Inventor: Yoshiharu Yoshii, Natori (JP)

(73) Assignee: SUMIDA CORPORATION, Tokyo (JP)

(*) Notice: Subject to any disclaimer, the term of this patent is extended or adjusted under 35 U.S.C. 154(b) by 0 days.

(21) Appl. No.: 17/349,472

(22) Filed: Jun. 16, 2021

(65) Prior Publication Data

US 2021/0311134 A1    Oct. 7, 2021

Related U.S. Application Data

(63) Continuation of application No. 16/521,005, filed on Jul. 24, 2019, now Pat. No. 11,067,646.

(30) Foreign Application Priority Data

Oct. 26, 2018  (JP) .............................. JP2018-202362

(51) Int. Cl.
 *G01R 33/02* (2006.01)
 *G01B 7/00* (2006.01)

(52) U.S. Cl.
 CPC .............. *G01R 33/02* (2013.01); *G01B 7/003* (2013.01)

(58) Field of Classification Search
 CPC .... G01R 33/02; G01R 33/0094; G01R 33/24; G01R 33/323; G01R 33/383; G01R 33/032; G01R 31/52; G01B 7/003; G01N 24/10

USPC ........................................................ 324/200
See application file for complete search history.

(56) References Cited

U.S. PATENT DOCUMENTS

| | | | |
|---|---|---|---|
| 5,437,276 A | 8/1995 | Takada | |
| 5,842,986 A | 12/1998 | Avrin et al. | |
| 7,272,520 B2 | 9/2007 | Sweeting | |
| 2007/0167703 A1* | 7/2007 | Sherman | A61B 5/06 600/407 |
| 2009/0276169 A1 | 11/2009 | Walsh et al. | |
| 2013/0265042 A1 | 10/2013 | Kawabata et al. | |
| 2016/0086080 A1* | 3/2016 | Foong | A61B 5/062 706/25 |
| 2017/0016963 A1* | 1/2017 | Kimura | G01R 31/389 |
| 2017/0038440 A1* | 2/2017 | Verfaeke | G01R 33/12 |
| 2017/0123019 A1* | 5/2017 | Vervaeke | G16Z 99/00 |

(Continued)

FOREIGN PATENT DOCUMENTS

| | | |
|---|---|---|
| JP | 5220123 A | 2/1992 |
| JP | 2016023965 A | 2/2016 |

(Continued)

*Primary Examiner* — Christopher P Mcandrew
(74) *Attorney, Agent, or Firm* — Cowan, Liebowitz & Latman, P.C.; Mark Montague

(57) ABSTRACT

In a magnetic field source detecting apparatus, a magnetic sensor unit detects an intensity and a direction of a measurement target magnetic field on or over a surface of a test target object; and a position estimating unit estimates a position in a depth direction of a magnetic field source that exists at an unspecified position inside a test target object on the basis of the intensities and the directions of the measurement target magnetic field detected by the magnetic sensor at at least two 2-dimensional positions of the surface.

8 Claims, 10 Drawing Sheets

(56) References Cited

U.S. PATENT DOCUMENTS

2017/0343695 A1 11/2017 Stetson et al.
2018/0306874 A1* 10/2018 Garraud ................ G01R 33/05

FOREIGN PATENT DOCUMENTS

| JP | 2016205954 A | 12/2016 |
| JP | 2018136316 A | 8/2018 |
| WO | 2013150926 A1 | 10/2013 |
| WO | 2015136931 A1 | 9/2015 |

* cited by examiner

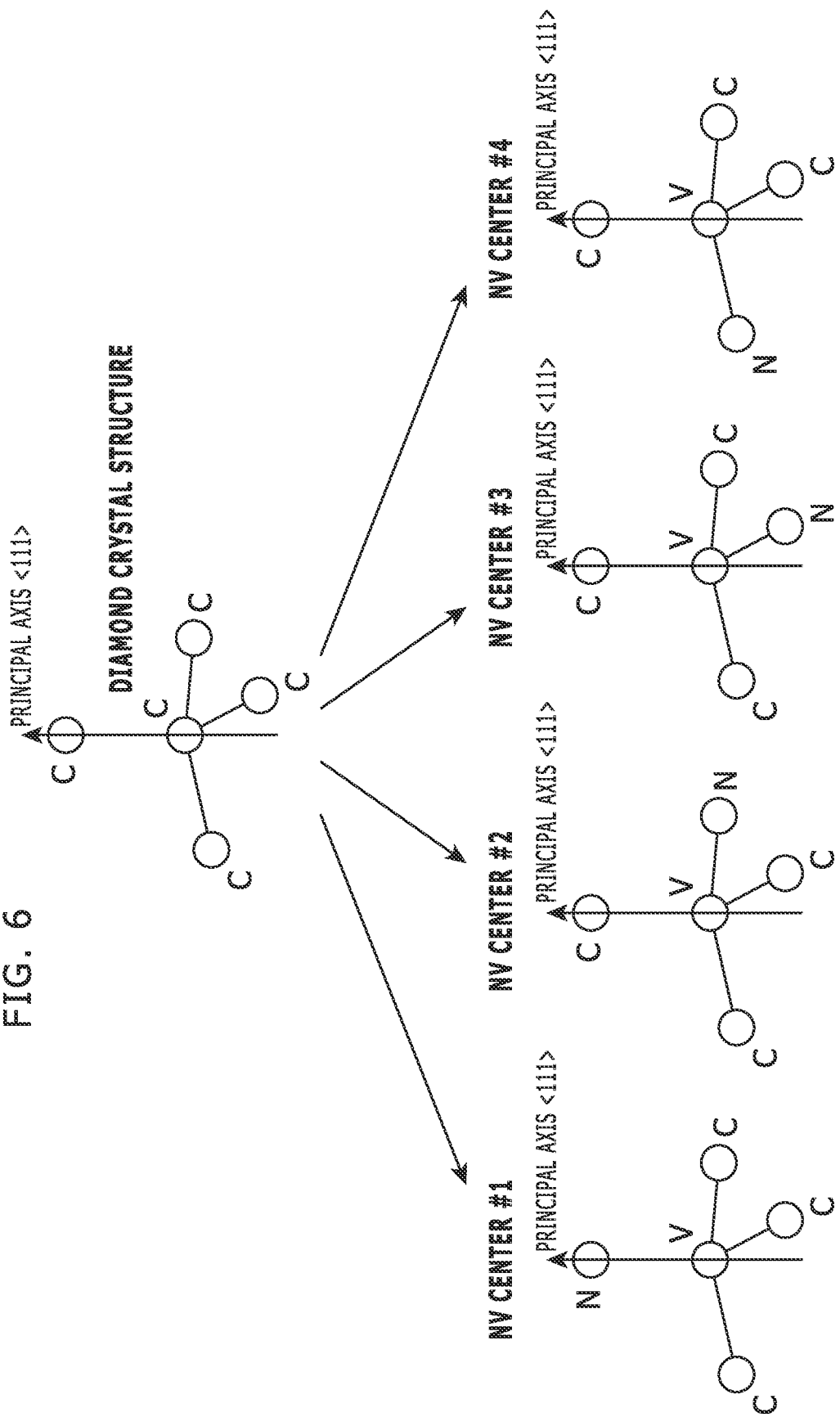

FIG. 10

$$\Delta \phi(x,y,z) = 0 \quad \ldots(1)$$

WHERE $\phi$ IS A MAGNETIC FIELD INTENSITY IN Z DIRECTION.

$$\tilde{\phi}(k_x,k_y,z) = \int_{-\infty}^{\infty} \int_{-\infty}^{\infty} e^{-ik_x x - ik_y y} \phi(x,y,z) dx dy \quad \ldots(2)$$

WHERE Kx, Ky ARE WAVE NUMBERS OF RESPETIVE COORDINATES.

$$\phi(x,y,z) = \frac{1}{(2\pi)^2} \int_{-\infty}^{\infty} \int_{-\infty}^{\infty} e^{ik_x x + ik_y y} \tilde{\phi}(k_x,k_y,z) dk_x dk_y$$

$$= \frac{1}{(2\pi)^2} \int_{-\infty}^{\infty} \int_{-\infty}^{\infty} e^{ik_x x + ik_y y} \left\{ a(k_x,k_y) e^{z\sqrt{k_x^2+k_y^2}} + b(k_x,k_y) e^{-z\sqrt{k_x^2+k_y^2}} \right\} dk_x dk_y$$

$$\ldots(3)$$

WHERE a AND b ARE CONSTANTS.

$$\tilde{f}(k_x,k_y) = \int_{-\infty}^{\infty} \int_{-\infty}^{\infty} e^{-ik_x x - ik_y y} f(x,y) dx dy = \tilde{\phi}_m(k_x,k_y,0)$$

$$\tilde{g}(k_x,k_y) = \int_{-\infty}^{\infty} \int_{-\infty}^{\infty} e^{-ik_x x - ik_y y} g(x,y) dx dy = \frac{d}{dz} \tilde{\phi}_m(k_x,k_y,0)$$

$$\ldots(4)$$

WHERE $\phi_m$ IS MEASUREMENT DATA.

$$\tilde{\phi}(k_x,k_y,z) = \frac{k_x \sqrt{k_x^2+k_y^2} \cosh\left(z\sqrt{k_x^2+k_y^2}\right) \tilde{f}(k_x,k_y) + k_x \sinh\left(z\sqrt{k_x^2+k_y^2}\right) \tilde{g}(k_x,k_y)}{4 \sin(\Delta x k_x/2) \sinh\left(\Delta z \sqrt{k_x^2+k_y^2}/2\right)} \quad \ldots(5)$$

WHERE $\Delta x, \Delta y$ ARE WIDTHS OF SENSING RANGES OF RESPECTIVE COORDINATES.

$$\phi(x,y,z) = \frac{1}{(2\pi)^2} \int_{-\infty}^{\infty} \int_{-\infty}^{\infty} e^{ik_x x + ik_y y} \tilde{\phi}(k_x,k_y,z) dk_x dk_y \quad \ldots(6)$$

MAGNETIC FIELD SOURCE DETECTING APPARATUS AND MAGNETIC FIELD SOURCE DETECTING METHOD

CROSS-REFERENCE TO RELATED APPLICATIONS

This application is a continuation of U.S. patent application Ser. No. 16/521,005, filed Jul. 24, 2019, which claims priority rights from Japanese Patent Application No. 2018-202362, filed Oct. 26, 2018, the entire disclosures of which are incorporated herein by reference in their entireties.

BACKGROUND

Technical Field

The present invention relates to a magnetic field source detecting apparatus and a magnetic field source detecting method.

Background Art

In a magnetic field source estimating method, an inner part of a test object is expressed as a 3-dimensional cubic lattice net, and using detection coils and a SQUID (superconducting quantum interference device) arranged in the outside of the test object, an electric current distribution at nodes in the 3-dimensional cubic lattice net is estimated as an electric current distribution in the test object (see PATENT LITERATURE #1).

Meanwhile, in an electric conductivity distribution deriving method, a magnetic sensor (TMR sensor) is scanned for obtaining magnetic field information over a surface of a test target object and thereby the magnetic field information is obtained, and a 2-dimensional internal electric conductivity distribution in the test target object (i.e. 2-dimensional electric conductivity distribution corresponding to the scanning plane) is derived (see PATENT LITERATURE #2).

CITATION LIST

Patent Literature

PATENT LITERATURE #1: Japanese Patent Application Publication No. H5-220123.
PATENT LITERATURE #2: International Publication WO2015/136931.

SUMMARY

Technical Problem

Although the aforementioned magnetic field source estimating method is capable of estimating the internal current distribution using the SQUID from an external magnetic field intensity distribution measured by the detection coils, the SQUID requires a very high cost and therefore is not practical in a general industry field (in particular, manufacturing industry field).

Further, although the aforementioned electrical conductivity distribution deriving method is capable of deriving the 2-dimensional electrical conductivity distribution, it hardly detects an electrical conductivity variation in a depth direction of the test target object.

The present invention is conceived in view of the aforementioned problem and aims for providing a magnetic field source detecting apparatus and a magnetic field source detecting method capable of estimating a position of a magnetic field source in a depth direction inside a test target object at a relatively low cost.

Solution to Problem

A magnetic field source detecting apparatus according to an aspect of the present invention includes a magnetic sensor unit that detects an intensity and a direction of a measurement target magnetic field on or over a surface of a test target object; and a position estimating unit that estimates a position in a depth direction of a magnetic field source that exists at an unspecified position inside a test target object on the basis of the intensities and the directions of the measurement target magnetic field detected by the magnetic sensor at at least two 2-dimensional positions of the surface.

A magnetic field source detecting method according to an aspect of the present invention includes the steps of: (a) detecting intensities and directions of a measurement target magnetic field at at least two 2-dimensional positions of a surface of a test target object using a magnetic sensor unit that detects an intensity and a direction of the measurement target magnetic field on or over the surface of the test target object; and (b) estimating a position in a depth direction of a magnetic field source that exists at an unspecified position inside the test target object on the basis of the intensities and the directions of the measurement target magnetic field detected at the at least two 2-dimensional positions.

Advantageous Effects of Invention

By means of the present invention, provided are a magnetic field source detecting apparatus and a magnetic field source detecting method capable of estimating a position of a magnetic field source in a depth direction inside a test target object at a relatively low cost.

These and other objects, features and advantages of the present disclosure will become more apparent upon reading of the following detailed description along with the accompanied drawings.

BRIEF DESCRIPTION OF THE DRAWINGS

FIG. 6 shows a diagram that explains plural orientations of an NV center;

FIG. 10 shows a diagram that indicates formulas in an example of magnetic field analysis.

DETAILED DESCRIPTION

Hereinafter, embodiments according to aspects of the present invention will be explained with reference to drawings.

Embodiment 1

Figure 1:
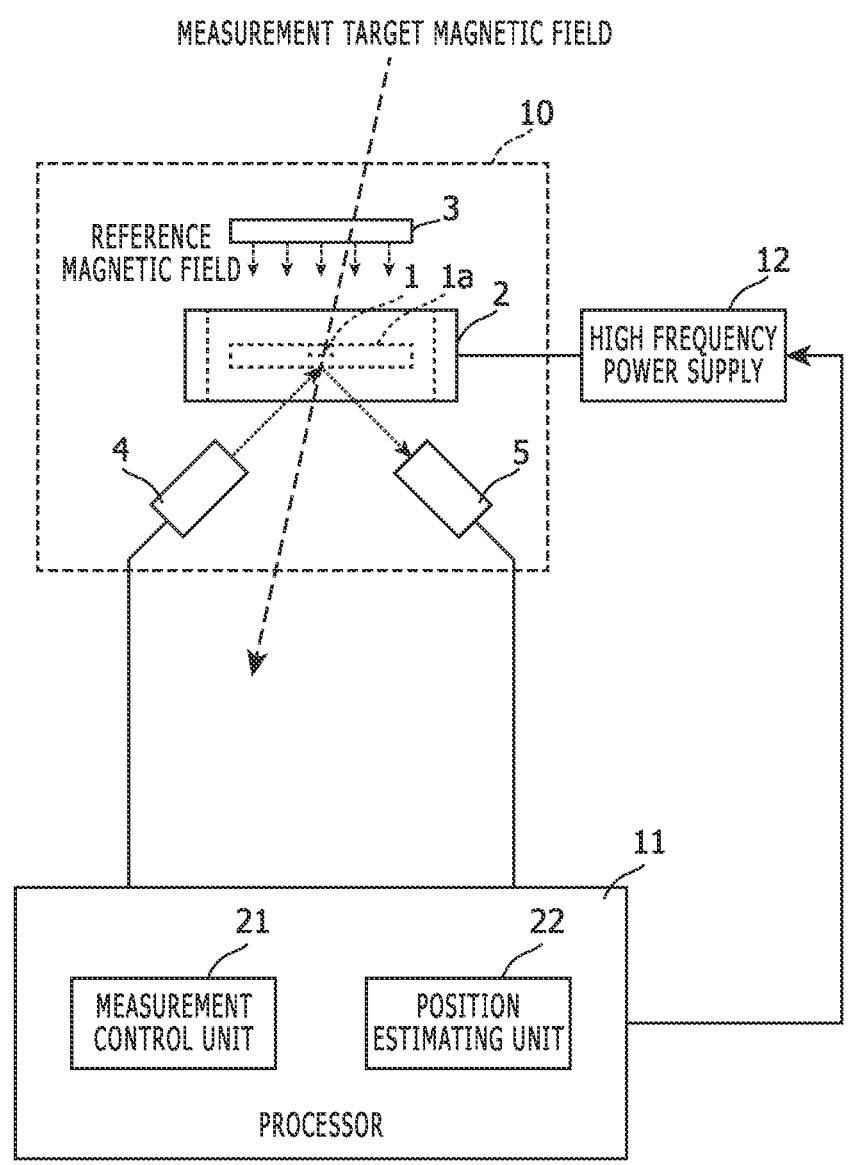
FIG. 1 shows a diagram that indicates a configuration of a magnetic field source detecting apparatus in an embodiment of the present invention.
Figure 2:
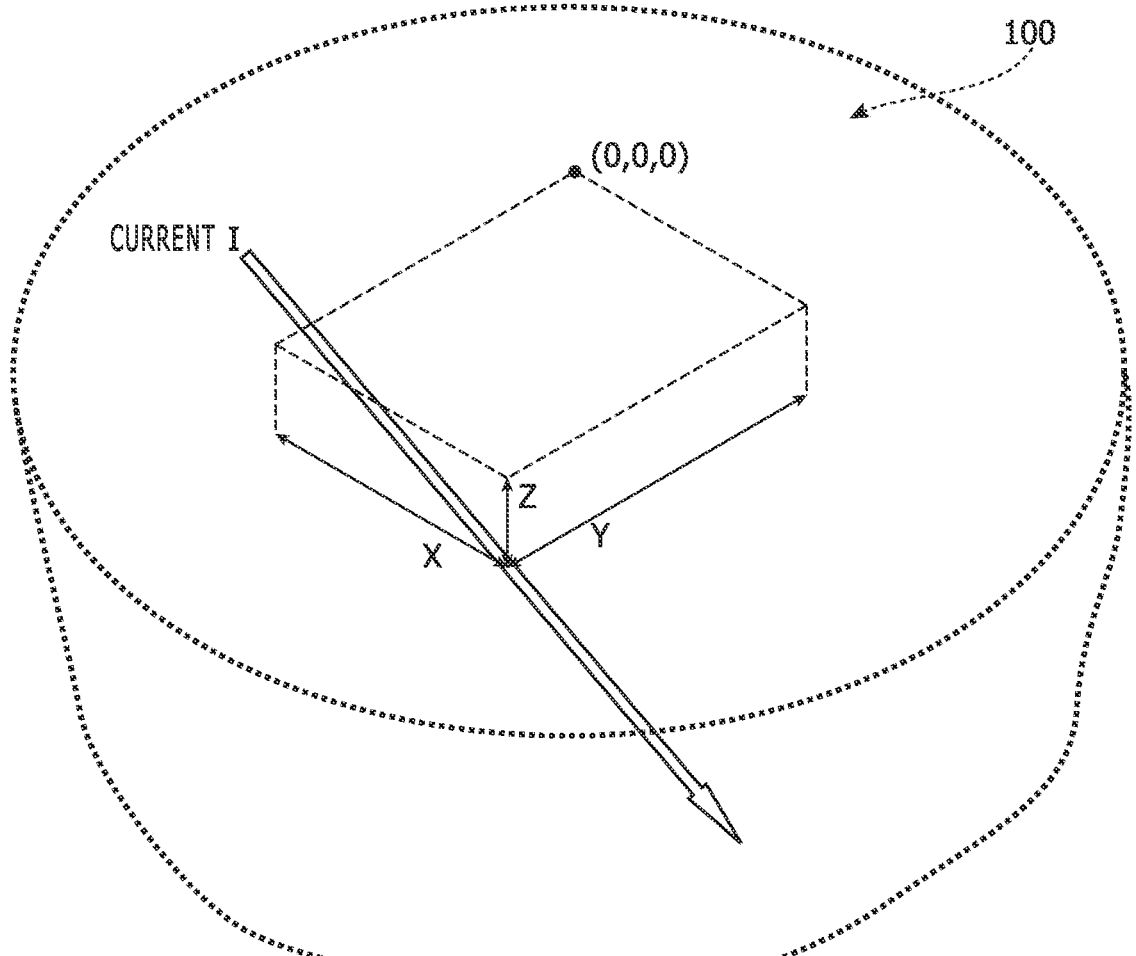
FIG. 2 shows a perspective view of a current as a magnetic field source inside a test target object.

FIG. 1 shows a diagram that indicates a configuration of a magnetic field source detecting apparatus in an embodiment of the present invention. FIG. 2 shows a perspective view of a current as a magnetic field source inside a test target object. The magnetic field source detecting apparatus shown in FIG. 1 detects a current I as a magnetic field source inside a test target object 100 as shown in FIG. 2. In Embodiment 1, the magnetic field source is (a) a current (e.g. a leakage current between electrodes or the like) that flows at an unspecified position inside the test target object 100 or (b) a current that flows at one of conduction paths laid in multilayers (e.g. wiring patterns laid on a front surface and a back surface of a single layer circuit board, wiring patterns laid on layers of multilayer circuit board or the like). Further, the test target object 100 is composed of a nonmagnetic material.

The magnetic field source detecting apparatus shown in FIG. 1 includes a magnetic sensor unit 10, a processor 11, and a high frequency power supply 12.

The magnetic sensor unit 10 detects an intensity and a direction of a measurement target magnetic field on or over the test target object 100. At each of measurement positions, the magnetic sensor unit 10 detects the intensity and the direction of the measurement target magnetic field at the same time.

In this embodiment, the magnetic sensor unit 10 includes an optically detected magnetic resonance (ODMR) member 1, a coil 2, a reference magnetic field generating unit 3, an irradiating device 4, and a light receiving device 5.

In this embodiment, the ODMR member 1 includes plural specific color centers. Each of the plural specific color centers has a Zeeman-splittable energy level and can take plural orientations of which energy level shift amounts due to Zeeman splitting are different from each other.

Here the ODMR member 1 is a board member such as a diamond including plural NV (Nitrogen Vacancy) centers as the specific color centers of a single type, and is fixed to a support board 1a. In the NV center, the ground level is a triplet level of Ms=0, +1, −1, and levels of Ms=+1 and Ms=−1 are Zeeman-splittable. Further, as mentioned below, in accordance with a positional relation between an atom (here, nitrogen) and a vacancy in a diamond crystal lattice, an NV center can take four orientations of which energy level shift amounts due to Zeeman splitting are different from each other.

The coil 2 applies a magnetic field of a microwave to the ODMR member 1. A frequency of the microwave is set in accordance with a type of the ODMR member 1 (i.e. in accordance with an energy difference between sublevels of a ground level of the specific color center). For example, if the ODMR member 1 is a diamond including an NV center, a frequency corresponding to an energy difference between sublevels (Ms=0 and Ms=+1,−i) without Zeeman splitting is about 2.87 GHz, and therefore the coil 2 applies a microwave of a predetermined frequency range including 2.87 GHz (i.e. a frequency range that includes a range corresponding to a shift amount of the sublevels due to Zeeman splitting). The high frequency power supply 12 causes the coil 2 to conduct a current of a microwave (i.e. a current to generate the aforementioned microwave as a magnetic field).

The reference magnetic field generating unit 3 applies a reference magnetic field (DC magnetic field) that causes Zeeman splitting of the energy level of the plural specific color centers (here, plural NV centers) in the ODMR member 1. A permanent magnet, a coil or the like is used as the reference magnetic field generating unit 3. If a coil is used as the reference magnetic field generating unit 3, a DC power supply is installed and is electrically connected to this coil and supplies DC current and thereby the reference magnetic field is generated. The aforementioned plural specific color centers have orientations different from each other, and by the reference magnetic field, the energy level of the plural specific color centers is Zeeman-splitted with different energy level shift amounts corresponding to the plural orientations, respectively.

The irradiating device 4 irradiates the ODMR member 1 with light (excitation light of a predetermined wavelength and measurement light of a predetermined wavelength). The light receiving device 5 detects fluorescence emitted from the ODMR member 1 when the ODMR member 1 is irradiated with the measurement light.

Further, the processor 11 includes a computer, for example, and executes a program with the computer and thereby acts as sorts of processing units. In this embodiment, the processor 11 acts as a measurement control unit 21 and a position estimating unit 22.

The measurement control unit 21 controls the high frequency power supply 12 and the irradiating device 4 in accordance with a predetermined DC magnetic field measurement sequence and thereby determines a detection light intensity of the fluorescence detected by the light receiving device 5 in the magnetic sensor unit 10. For example, the irradiating device 4 includes a laser diode or the like as a light source, and the light receiving device 5 includes a photo diode or the like as a photodetector, and the measurement control unit 21 determines the aforementioned detection light intensity on the basis of an output signal of the light receiving device 5, and this output signal is obtained by amplification and/or the like of an output signal of the photodetector.

In this embodiment, Ramsey Pulse Sequence is applied as the aforementioned predetermined DC magnetic field measurement sequence. However, the aforementioned DC magnetic field measurement sequence is not limited to that.

The position estimating unit 22 estimates a position in 2 dimensions of a surface of the test target object 100 and a position in a depth direction of a magnetic field source that exists at an unspecified position inside the test target object 100 on the basis of the intensities and the directions of the measurement target magnetic field detected by the magnetic sensor at at least two 2-dimensional positions of the surface of the test target object 100.

Figure 3:
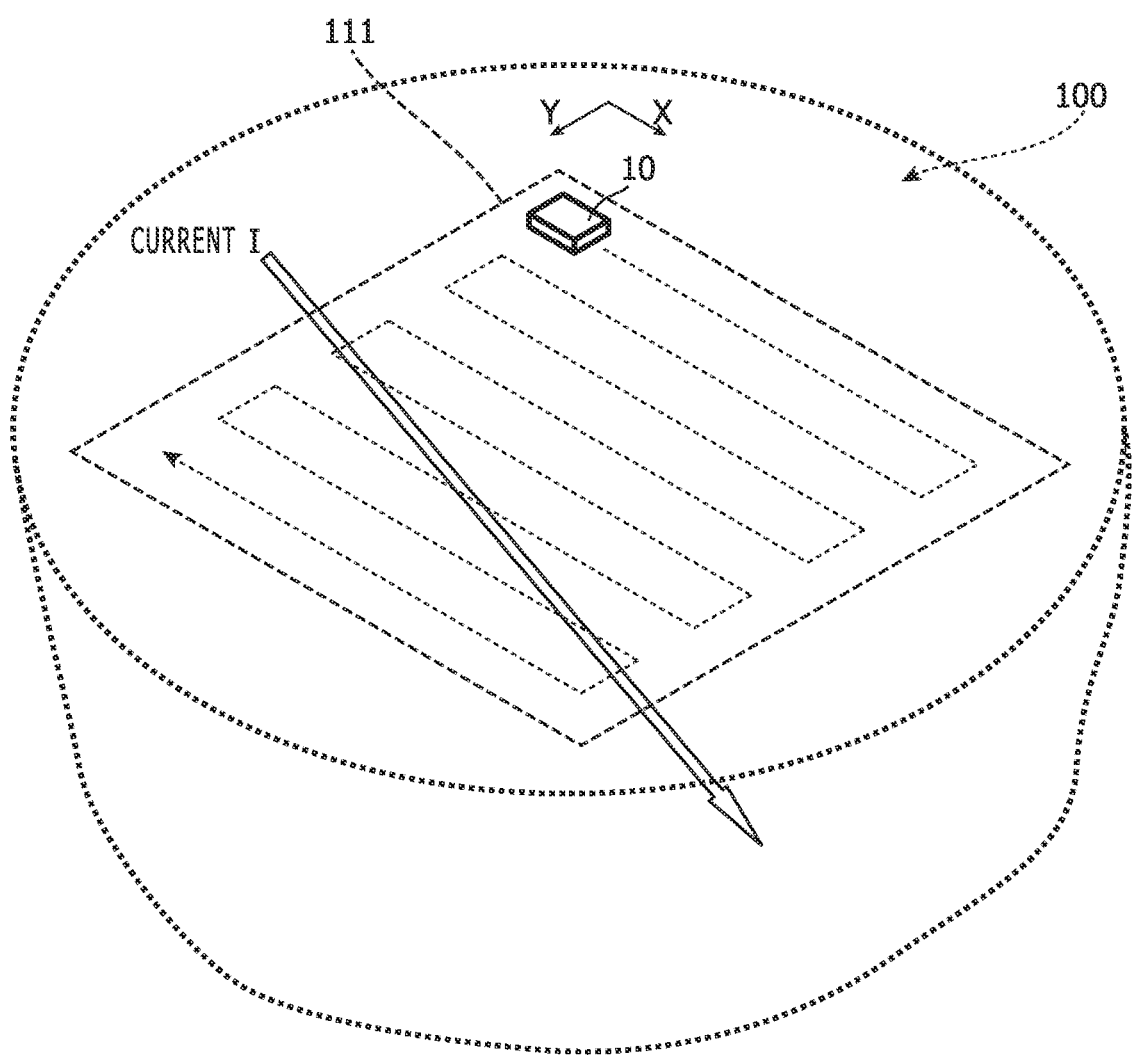
FIG. 3 shows a perspective view that explains scanning of a magnetic sensor 10 in Embodiment 1.

FIG. 3 shows a perspective view that explains scanning of a magnetic sensor 10 in Embodiment 1. The measurement control unit 21 controls a driving device such as a slider (not shown) and thereby scans the magnetic sensor unit 10 in a planar measurement area 111 in 2 dimensions (X direction and Y direction) of a surface of the test target object 100, for example, as shown in FIG. 3, and performs magnetic field measurement using the magnetic sensor 10 at plural positions on the scanning path thereof. A pattern of the scanning path of the magnetic sensor unit 10 is not limited to that shown in FIG. 3.

Figure 4:
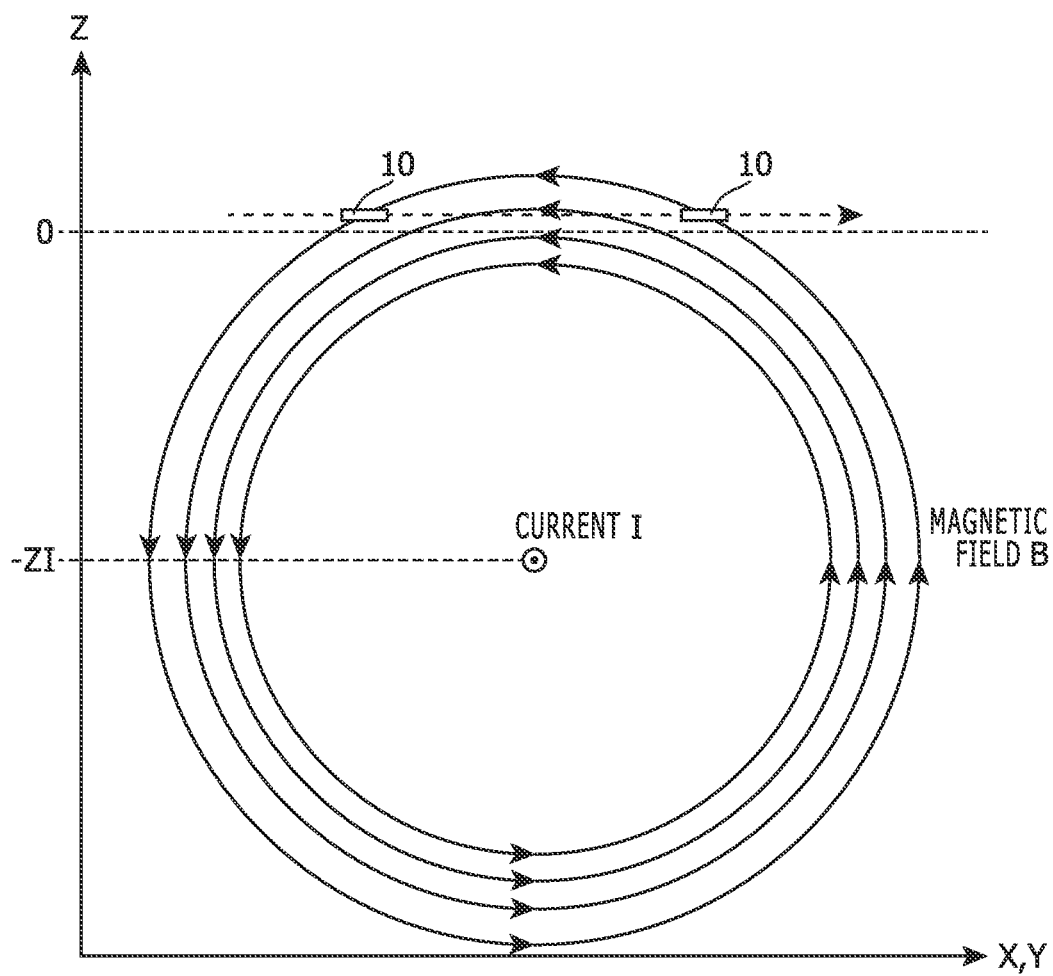
FIG. 4 shows a diagram that explains a magnetic field induced by a current as a magnetic field source.
Figure 5A:
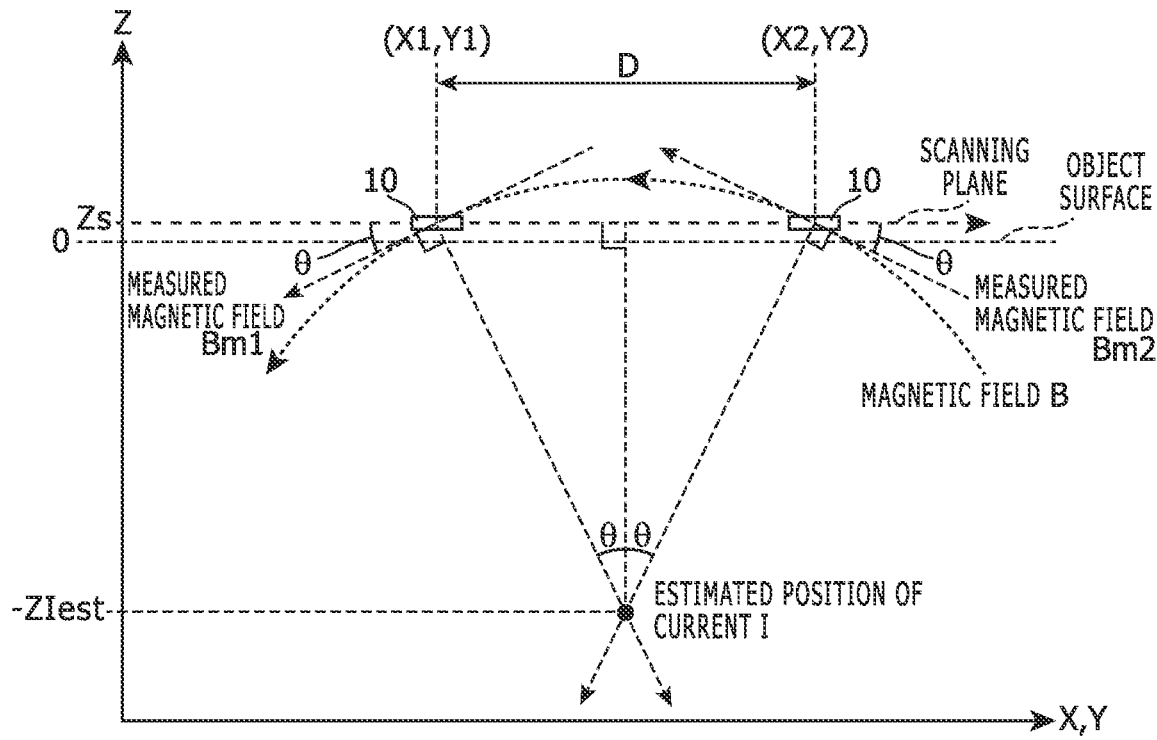
FIGS. 5A and 5B show diagrams that explain estimation of a position in a depth direction of a current as a magnetic field source in Embodiment 1.
Figure 5B:
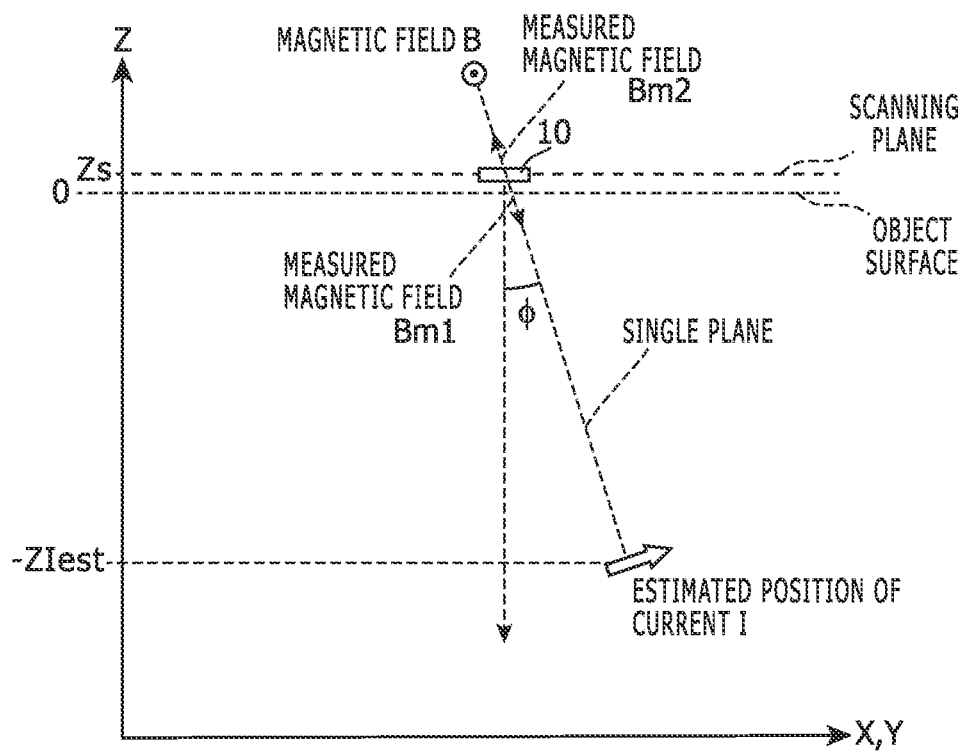

FIG. 4 shows a diagram that explain a magnetic field induced by a current as a magnetic field source. FIGS. 5A and 5B show diagrams that explains estimation of a position in a depth direction of a current as a magnetic field source in Embodiment 1.

As shown in FIG. 4, if a current I has substantially straight line shape, the current I induces a rotational magnetic field in accordance with Ampere's law. Therefore, an intensity and a direction of the magnetic field induced by the current I vary at positions in X direction (and/or Y direction on the scanning path.

Therefore, (a) a pair of two positions are detected such that (a1) a position where the magnetic field intensity has a peak is located between the two positions on the scanning path and (a2) the magnetic field intensities measured at the two positions are substantially identical to each other, (b) among the detected one or more pairs, a pair is selected such that two vectors of a measured magnetic fields Bm1 and Bm2 at the two positions lies on a single plane, and (c) as shown in FIG. 5A for example, with regard to the two positions (X1, Y1) and (X2, Y2) of the selected pair, derived is an intersection point of a normal direction to a direction of the measured magnetic field Bm1 and a normal direction to a direction of the measured magnetic field Bm2; and the position of the current I corresponding to the measured magnetic fields Bm1 and Bm2 is estimated as this intersection point.

It should be noted that if the single plane is tilted from a normal direction of the surface of the test target object 100 by an angle $\phi$ (i.e. the current I is tilted from a normal direction of the depth direction), then the position in the depth direction of the current I is corrected by $\cos(\phi)$. Contrarily, if it is known that the current I is not tilted from a normal direction of the depth direction (i.e. the current I flows in parallel with the surface), then the determination of the angle $\phi$ and the correction by $\cos(\phi)$ are not necessary because $\phi=90$ degrees.

Thus, in this case, the estimated position ZIest in the depth direction of the current I is derived in accordance with the following formula.

$$ZIest=(D/2)*\cos(\theta)*\cos(\phi)-Zs$$

Here $\theta$ is an angle between a scanning surface (here the scanning plane) of the magnetic sensor unit 10 and the measured magnetic fields Bm1 and Bm2. Further, Zs is a height from the surface of the test target object 100 to the scanning surface of the magnetic sensor unit 10. Furthermore, D is a distance between the two positions (X1, Y1) and (X2, Y2).

In addition, estimated positions XIest and YIest of the current I in 2 dimensional directions (X direction and Y direction) of the surface are derived from the two positions (X1, Y1) and (X2, Y2) and the measured magnetic fields Bm1 and Bm2 using a geometric computation as well.

Here the 3-dimensional position of the current I is estimated from the magnetic field measurement results at two positions. Alternatively, the position of the current I may be estimated from the magnetic field measurement results at three or more positions (e.g. four positions).

Further, the position estimating unit 22 estimates a position in a depth direction of the magnetic field source on the basis of (a) a distribution characteristic of the measurement target magnetic field corresponding to a type (electric current in Embodiment 1) of the magnetic field source and (b) the intensities and the directions of the measurement target magnetic field determined at the at least two positions as mentioned.

If a type of the magnetic field source is a current of a substantially straight line shape, then a distribution characteristic of the measurement target magnetic field is governed by Ampere's law as mentioned, and therefore a position in a depth direction of the magnetic field source is estimated on the basis of a known distribution characteristic induced by a current of a substantially straight line shape. In such a manner, the position estimating unit 22 performs computation corresponding to a type of the magnetic field source and thereby derives a position in a depth direction of the magnetic field source from an intensity and a direction of the measurement target magnetic field.

If the type of the magnetic field source is unknown, then the position estimating unit 22 may (a) estimate the type of the magnetic field source from intensities and directions of the measurement target magnetic field obtained at plural positions on the scanning path and (b) estimate a position in a depth direction of the magnetic field source on the basis of a distribution characteristic of the measurement target magnetic field corresponding to the estimated type of the magnetic field source.

In this embodiment, the measurement control unit 21 controls the high frequency power supply 12 and thereby changes a frequency of the microwave, and determines a frequency characteristic of intensities of the light on the basis of the electronic signal obtained from the light receiving device 5 at each of predetermined plural positions (e.g. with a regular interval as an distance) on the aforementioned scanning path; and the position estimating unit 22 (a) determines a magnetic field component due to the measurement target magnetic field corresponding to each of the aforementioned plural orientations on the basis of the frequency characteristic, (b) determines an intensity and a direction of the measurement target magnetic field on the basis of the magnetic field components corresponding to the aforementioned plural orientations (i.e. by combining magnetic field component vectors corresponding to the plural orientations), and (c) estimates a position in a depth direction of the magnetic field source on the basis of the intensities and the directions of the measurement target magnetic field determined at the aforementioned at least two positions.

Figure 7:
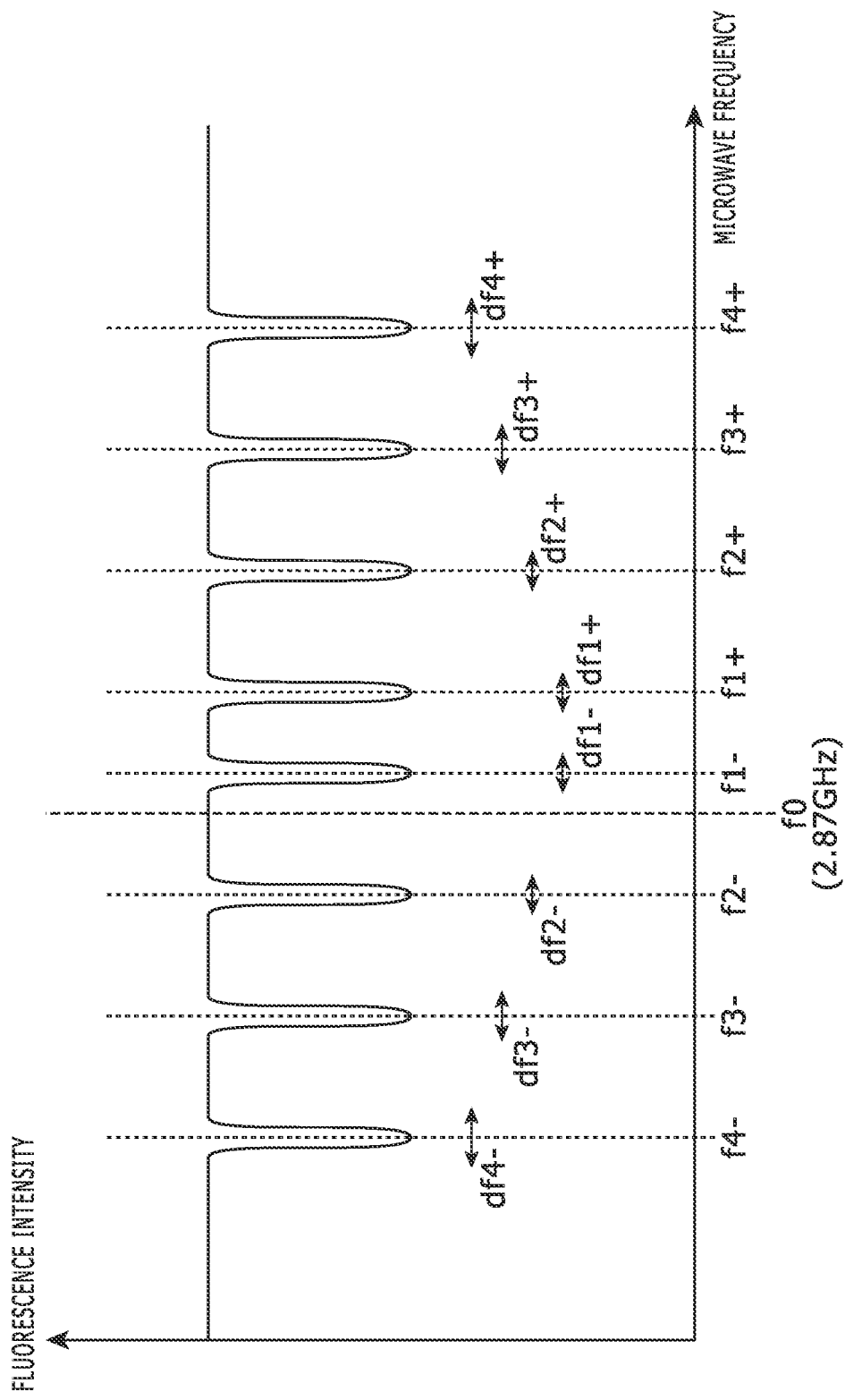
FIG. 7 shows a diagram that explains a frequency characteristic of fluorescence intensities corresponding to plural orientations of an NV center after Zeeman splitting of the NV center.

FIG. 6 shows a diagram that explains plural orientations of an NV center. FIG. 7 shows a diagram that explains a frequency characteristic of fluorescence intensities (i.e. fluorescence intensity characteristics to microwave frequency) corresponding to plural orientations of an NV center after Zeeman splitting of the NV center.

As shown in FIG. 6, in a diamond crystal, a nitrogen (N) adjacent to a vacancy (V) can take four positions, and shift amounts of the sublevels due to Zeeman splitting are different from each other in these positions (i.e. orientations of a pair of the vacancy and the nitrogen), respectively. Therefore, as shown in FIG. 7, in a characteristic of fluorescence intensities to frequencies of the microwave after Zeeman splitting due to the reference magnetic field, dip frequency pairs (fi+, fi−) corresponding to the orientations i appear differently from each other.

Further, the direction of the measurement target magnetic field is determined by determining shift amounts dfi+ and dfi− of the four dip frequency pairs (fi+, fi−) corresponding to the aforementioned four orientations, respectively. Specifically, by an experiment or the like, a relationship was determined in advance between (a) an angle between a reference direction in a geometric shape of the magnetic sensor unit 10 and the direction of the measurement target magnetic field and (b) a pattern of the shift amounts of the four dip frequency pairs (fi+, fi−); and the direction of the measurement target magnetic field is determined from the shift amounts dfi+ and dfi− of the four dip frequency pairs (fi+, fi−) on the basis of the relationship. In addition, the intensity of the measurement target magnetic field is determined from magnitudes of the shift amounts of the four dip frequency pairs (fi+, fi−).

As mentioned, in this embodiment, the intensity and the direction of the measurement target magnetic field is determined with the magnetic sensor unit 10 that uses diamond NV centers.

It should be noted that when other color centers are used as the aforementioned specific color centers instead of NV centers, the intensity and the direction of the measurement target magnetic field can be determined in the same manner.

Figure 8:
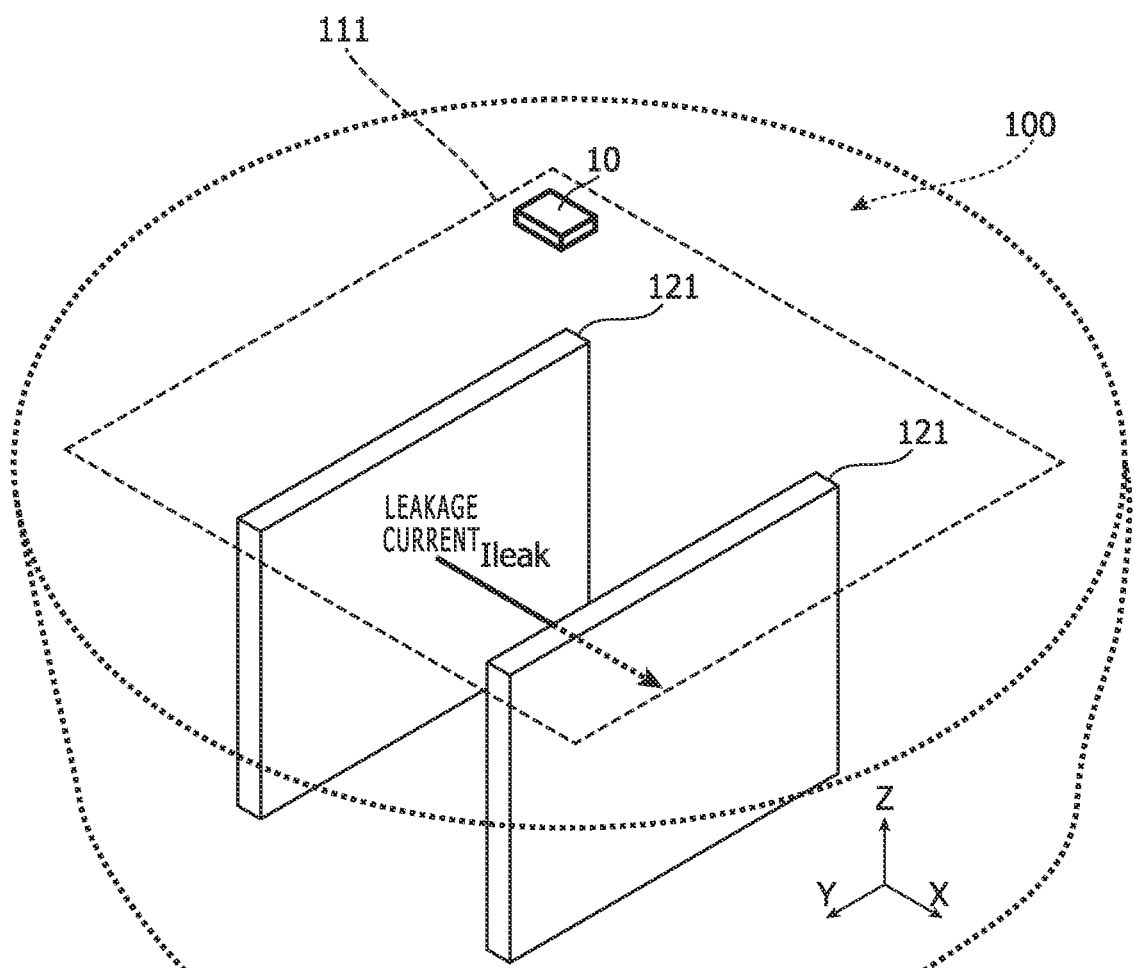
FIG. 8 shows a diagram that indicates an example of a leakage current as a magnetic field source that occurs between electrodes inside a test target object.
Figure 9:
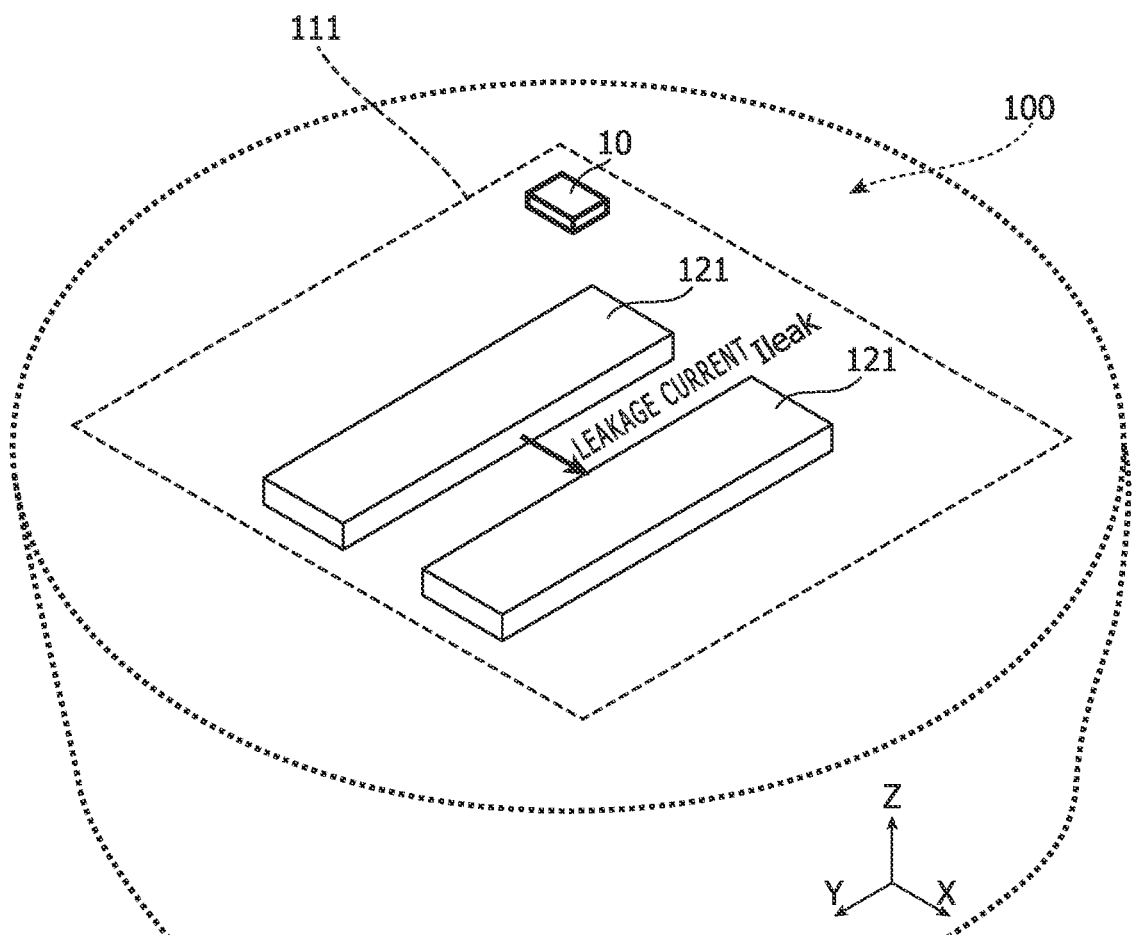
FIG. 9 shows a diagram that indicates another example of a leakage current as a magnetic field source that occurs between electrodes inside a test target object.

The current I inside the aforementioned test target object 100 may be a leakage current Ileak between electrodes inside the test target object 100, for example. FIG. 8 shows a diagram that indicates an example of a leakage current as a magnetic field source that occurs between electrodes inside a test target object. FIG. 9 shows a diagram that indicates another example of a leakage current as a magnetic field source that occurs between electrodes inside a test target object.

For example, as shown in FIG. 8, the aforementioned manner can estimate a position (i.e. leakage path) of a leakage current Ileak between two electrodes 121 that are perpendicular to the scanning plane (X-Y plane) of the magnetic sensor unit 10 and arrayed along a direction in parallel with the scanning plane.

Further, for example, as shown in FIG. 9, the aforementioned manner can estimate a position (i.e. leakage path) of a leakage current Ileak between two electrodes 121 that are in parallel with the scanning plane (X-Y plane) of the magnetic sensor unit 10 and arrayed along a direction in parallel with the scanning plane.

The following part explains a behavior of the magnetic field source detecting apparatus in Embodiment 1.

The measurement control unit 21 moves the magnetic sensor unit 10 along a predetermined scanning pattern and causes the magnetic sensor unit 10 to detect intensities and directions of a magnetic field at predetermined measurement positions on the scanning path.

Subsequently, the position estimating unit 22 selects, as a measurement position set, at least two measurement positions to be used for the position estimation among all the measurement positions as mentioned, and estimates a position of a current I corresponding to the selected measurement positions (i.e. a position in the depth direction (Z direction) and a position on the surface (in X direction and Y direction) corresponding to the position in the depth direction) on the basis of the intensities and the directions of the magnetic field measured at the selected measurement positions as the measurement position set.

In such a manner, the position estimating unit 22 extracts plural measurement position set among all the measurement positions, estimates a position of the current I corresponding to each of the measurement position set, and consequently, determines a path of the current I.

As mentioned, in Embodiment 1, the magnetic sensor unit 10 detects an intensity and a direction of a measurement target magnetic field on or over the test target object 100. The position estimating unit 22 estimates a position ZIest in a depth direction of a magnetic field source (here, the current I) that exists at an unspecified position inside the test target object 100 on the basis of the intensities and the directions of the measurement target magnetic field detected by the magnetic sensor 10 at at least two 2-dimensional positions of the surface of the test target object 100.

Consequently, a position of a magnetic field source in a depth direction inside the test target object 100 is estimated at a relatively low cost.

In particular, in Embodiment 1, a magnetic sensor that uses the aforementioned specific color centers is used in the magnetic sensor unit 10, and consequently, a position of a fine current such as leakage current as a magnetic field source can be estimated.

Embodiment 2

Instead of moving the magnetic sensor unit 10, the magnetic field source detecting apparatus in Embodiment 2 uses a sensor array in which the plural magnetic sensor units 10 are 2-dimensionally arrayed in the measurement area 111, and an intensity and a direction of a magnetic field is measured at each position by the magnetic sensor unit 10 fixedly arranged at this position. Subsequently, a position of a magnetic field source (electric current or the like) is estimated from the intensities and the directions of the magnetic field at these positions as well as in Embodiment 1.

Other parts of configuration and behaviors of the magnetic field source detecting apparatus in Embodiment 2 are identical or similar to those in Embodiment 1, and therefore not explained here.

Embodiment 3

In Embodiment 3, the magnetic field source is a magnetic object (i.e. ferromagnetism object) that has entered at an unspecified position inside the nonmagnetic (i.e. paramagnetism) test target object 100, and the magnetic field source detecting apparatus estimates a position of the magnetic object.

When the magnetic object is not magnetized, an external magnetic field is temporarily applied to the test target object and thereby the magnetic object is magnetized. Subsequently, if a shape of the magnetic object and/or a distribution characteristic of the measurement target magnetic field are/is known, then as well as in Embodiment 1 or 2, a position (including a position in a depth direction) and an orientation (posture) of the magnetic object are estimated from a distribution of intensities and directions of a magnetic field obtained at plural position in 2 dimension (i.e. X-Y plane).

Other parts of configuration and behaviors of the magnetic field source detecting apparatus in Embodiment 3 are identical or similar to those in Embodiment 1 or 2, and therefore not explained here.

It should be understood that various changes and modifications to the embodiments described herein will be apparent to those skilled in the art. Such changes and modifications may be made without departing from the spirit and scope of the present subject matter and without diminishing its intended advantages. It is therefore intended that such changes and modifications be covered by the appended claims.

For example, in the aforementioned Embodiment 1 or 2, the aforementioned current to be detected is a leakage current between electrodes as mentioned, for example.

Alternatively, the aforementioned current to be detected may be a current that flows on a wiring pattern or an internal leakage current in a semiconductor integrated circuit in a burn-in test of a semiconductor integrated circuit chip.

Further, in the aforementioned Embodiment 3, the aforementioned magnetic object to be detected is, for example, a metal piece that has entered in food as the test target material, a metal piece such as needle that has entered in clothing as the test target material or the like. Furthermore, in the aforementioned Embodiment 3, the magnetic field source detecting apparatus may be applied to a metal detector that is installed in an airport or the like, and the magnetic object to be detected may be a metal product (e.g. knife, gun or the like) carried by a person as the test target object. Furthermore, in the aforementioned Embodiment 3, the magnetic object to be detected may be a metal biological tracer that is inserted to a living body of a person, an animal, a plant or the like. If a shape of such a test target object does not have a planar surface, then the test target object should be arranged under a (nonmagnetic) planer stage and the magnetic sensor unit 10 should be scanned on or over the planer stage.

Furthermore, in the aforementioned Embodiment 3, the external magnetic field to magnetize the magnetic object to be detected and the aforementioned reference magnetic field may be generated by a single magnetic field generating unit.

Furthermore, in Embodiment 1, 2 or 3, the ODMR member 1 includes diamond NV centers as the aforementioned specific color centers. Alternatively, SiV centers, GeV centers, SnV centers or the like may be used in the ODMR member 1. In addition, a crystal as a base material that includes the specific color centers may be SiC other than diamond.

Furthermore, in Embodiment 1, 2 or 3, an intensity and a direction of an environmental magnetic field such as geomagnetism may be measured using another magnetic sensor unit identical or similar to the magnetic sensor unit 10 at a position that is not affected by the measurement target magnetic field, and an intensity and a direction of the measurement target magnetic field obtained by the magnetic sensor unit 10 may be corrected with the measured intensity and direction of the environmental magnetic field.

Furthermore, in Embodiment 1, 2 or 3, analysis of the magnetic field distribution φ (x, y, z) in the test target object may be performed using formulas shown in FIG. 10 on the basis of intensities φm of the measurement target magnetic field obtained by the magnetic sensor unit 10 on the measurement surface (i.e. the scanning plane), and a position of the magnetic field source may be estimated from the magnetic field distribution φ (x, y, z). Specifically, in a steady magnetic field, a magnetic field intensity φ in a Z direction satisfies Laplace's equation as shown in Formula (1). When Fourier transformation is performed for the magnetic field intensity φ as shown in Formula (2) and inverse Fourier transform is performed for the magnetic field intensity after Fourier-transformation, Formula (3) is obtained. Fourier-transformation of the magnetic field intensity φm obtained on the measurement surface and differentiation of it by Z are defined as shown in Formula (4), the magnetic field intensity after Fourier-transformation is obtained through Fourier-transformation from the magnetic field intensity φm as shown in Formula (5), and the target magnetic field distribution φ (x, y, z) is obtained as shown in Formula (6) by inverse Fourier transform of the magnetic field intensity after Fourier transform shown in Formula (5).

INDUSTRIAL APPLICABILITY

For example, the present invention is applicable to detection of a magnetic field source.

What is claimed is:

1. A method for detecting a magnetic field source in a target object, comprising:
    detecting an intensity and a direction of a measurement target magnetic field on or over a surface of the target object by a magnetic sensor unit, and
    calculating a position in a depth direction of the magnetic field source that exists at an unspecified position inside the target object on a basis of the intensities and the directions of the measurement target magnetic field detected,
    wherein the magnetic sensor unit is controlled to move along a predetermined scanning path,
    wherein:
    (a) a pair of two positions are detected such that
        (a1) a position where the magnetic field intensity has a peak is located between the two positions on the scanning path, and
        (a2) the magnetic field intensities measured at the two positions are substantially identical to each other,
    (b) among the detected one or more pairs, a pair is selected such that two vectors of a measured magnetic fields at the two positions lies on a single plane, and
    (c) with regard to the two positions and of the selected pair, derived is an intersection point of a normal direction to a direction of one of the measured magnetic fields and a normal direction to a direction of another one of the measured magnetic fields; and the position of the magnetic field source is estimated as this intersection point.

2. A method for detecting a magnetic field source in a target object according to claim 1, wherein:
    in the step of calculating the position in the depth direction of the magnetic field source, the calculation is based on:
    (a) a distribution characteristic of the measurement target magnetic field corresponding to a type of the magnetic field source, and
    (b) the intensities and the directions of the measurement target magnetic field determined at the at least two positions.

3. A method for detecting a magnetic field source in a target object according to claim 1,
    further including a correct calculating for the estimated position of the magnetic field source in the depth direction according to a formula below:

$$ZIest=(D/2)*\cos(\theta)*\cos(\phi)-Zs$$

wherein: θ is an angle between a scanning plane of the magnetic sensor unit and the measured magnetic fields, Zs is a height from the surface of the test target object to the scanning plane of the magnetic sensor unit, and D is a distance between the two positions.

4. A method for detecting a magnetic field source in a target object according to claim 1, wherein
    the magnetic sensor unit comprises
    an optically detected magnetic resonance member,
    a coil that applies a magnetic field of a microwave to the optically detected magnetic resonance member,
    an irradiating device that irradiates the optically detected magnetic resonance member with light,
    and a light receiving device that detects light that the optically detected magnetic resonance member emits and outputs an electronic signal corresponding to the detected light,
    the optically detected magnetic resonance member comprises plural specific color centers, the specific color center has a Zeeman-splittable energy level and can take plural orientations of which energy level shift amounts due to Zeeman splitting are different from each other, the reference magnetic field generating unit applies a reference magnetic field that causes Zeeman splitting of the energy level of the plural specific color centers, the plural specific color centers have plural orientations different from each other, and the energy level of the plural specific color centers is Zeeman-splitted with different energy level shift amounts corresponding to the plural orientations by the reference magnetic field, respectively, a measurement control unit changes a frequency of the microwave and determines a frequency characteristic of intensities of the light based on the electronic signal at each of predetermined plural positions.

5. A method for detecting a magnetic field source in a target object according to claim 4, wherein
a position estimating unit
(a) determines a magnetic field component due to the measurement target magnetic field corresponding to each of the plural orientations on the basis of the frequency characteristic,
(b) determines an intensity and a direction of the measurement target magnetic field on the basis of the magnetic field components corresponding to the plural orientations, and
(c) estimates a position in a depth direction of the magnetic field source on the basis of the intensities and the directions of the measurement target magnetic field determined at the at least two positions.

6. A method for detecting a magnetic field source in a target object, comprising:
detecting an intensity and a direction of a measurement target magnetic field on or over a surface of the target object by a magnetic sensor unit, and
calculating a position in a depth direction of the magnetic field source that exists at an unspecified position inside the target object on a basis of the intensities and the directions of the measurement target magnetic field detected,
wherein the magnetic sensor unit is controlled to move along a predetermined scanning path,
wherein the magnetic sensor unit comprises:
an optically detected magnetic resonance member,
a coil that applies a magnetic field of a microwave to the optically detected magnetic resonance member,
an irradiating device that irradiates the optically detected magnetic resonance member with light,
and a light receiving device that detects light that the optically detected magnetic resonance member emits and outputs an electronic signal corresponding to the detected light,
the optically detected magnetic resonance member comprises plural specific color centers, the specific color center has a Zeeman-splittable energy level and can take plural orientations of which energy level shift amounts due to Zeeman splitting are different from each other, the reference magnetic field generating unit applies a reference magnetic field that causes Zeeman splitting of the energy level of the plural specific color centers, the plural specific color centers have plural orientations different from each other, and the energy level of the plural specific color centers is Zeeman-splitted with different energy level shift amounts corresponding to the plural orientations by the reference magnetic field, respectively, a measurement control unit changes a frequency of the microwave and determines a frequency characteristic of intensities of the light based on the electronic signal at each of predetermined plural positions.

7. A method for detecting a magnetic field source in a target object according to claim 6, wherein
in the step of calculating the position in the depth direction of the magnetic field source, the calculation is based on:
(a) a distribution characteristic of the measurement target magnetic field corresponding to a type of the magnetic field source, and
(b) the intensities and the directions of the measurement target magnetic field determined at the at least two positions.

8. A method for detecting a magnetic field source in a target object according to claim 6, wherein:
(a) a pair of two positions are detected such that
(a1) a position where the magnetic field intensity has a peak is located between the two positions on the scanning path, and
(a2) the magnetic field intensities measured at the two positions are substantially identical to each other,
(b) among the detected one or more pairs, a pair is selected such that two vectors of a measured magnetic fields at the two positions lies on a single plane, and
(c) with regard to the two positions and of the selected pair, derived is an intersection point of a normal direction to a direction of one of the measured magnetic fields and a normal direction to a direction of another one of the measured magnetic fields; and the position of the magnetic field source is estimated as this intersection point,
the method further including a correct calculating for the estimated position of the magnetic field source in the depth direction according to a formula below:

$ZIest = (D/2) * \cos(\theta) * \cos(\phi) - Zs$ wherein: $\theta$ is an angle between a scanning plane of the magnetic sensor unit and the measured magnetic fields, $Zs$ is a height from the surface of the test target object to the scanning plane of the magnetic sensor unit, and $D$ is a distance between the two positions.

* * * * *